US00RE41516E

(19) United States
(12) Reissued Patent
Grilletto

(10) Patent Number: US RE41,516 E
(45) Date of Reissued Patent: Aug. 17, 2010

(54) SOCKETLESS/BOARDLESS TEST INTERPOSER CARD

(75) Inventor: Carlo Grilletto, Doylestown, PA (US)

(73) Assignee: LSI Corporation, Milpitas, CA (US)

(21) Appl. No.: 11/324,119

(22) Filed: Dec. 30, 2005

Related U.S. Patent Documents

Reissue of:
(64) Patent No.: 6,771,085
Issued: Aug. 3, 2004
Appl. No.: 10/428,200
Filed: Apr. 30, 2003

U.S. Applications:

(62) Division of application No. 10/306,064, filed on Nov. 27, 2002, now Pat. No. 6,597,189.

(51) Int. Cl.
*G01R 31/26* (2006.01)

(52) U.S. Cl. ..... 324/765; 324/756
(58) Field of Classification Search ..... 324/158.1, 324/754–765; 438/14, 17
See application file for complete search history.

(56) References Cited

U.S. PATENT DOCUMENTS 4,821,146 A 4/1989 Behrens et al. ..... 361/383
5,929,646 A * 7/1999 Patel et al. ..... 324/754
6,597,189 B1 * 7/2003 Grilletto ..... 324/755

* cited by examiner

*Primary Examiner*—Ha Tran T Nguyen
*Assistant Examiner*—Trung Q Nguyen
(74) *Attorney, Agent, or Firm*—Cochran Freund & Young LLC

(57) ABSTRACT

An interposer card used during qualification tests on integrated circuit packages is disclosed that eliminates the need for sockets and custom boards. The interposer card includes pads for mounting the I/Os of a test package; edge card connectors for connecting the interposer card directly to a test board and for performing bias testing on the test package; and pads for replicating the test package I/Os for connecting the interposer card to an automated electrical testing (ATE) system for performing ATE tests on the test package.

12 Claims, 3 Drawing Sheets

SOCKETLESS/BOARDLESS TEST INTERPOSER CARD

Matter enclosed in heavy brackets [ ] appears in the original patent but forms no part of this reissue specification; matter printed in italics indicates the additions made by reissue.

CROSS-REFERENCE TO RELATED APPLICATIONS

The present application is a divisional of U.S. application Ser. No. 10/306,064, now U.S. Pat. No. 6,597,198 filed Nov. 27, 2002, and assigned of record to LSI Logic Corporation, of Milpitas, Calif.

FIELD OF THE INVENTION

The present invention relates to methods for testing integrated circuits, and more particularly to a system for performing qualification tests on integrated cicuit packages that eliminates the need for stress sockets and device specific custom boards.

BACKGROUND OF THE INVENTION

Integrated circuits are typically packaged before they are used with other components as part of a larger electronic system. Ball grid array (BGA) packages, for example, are constructed with die mounted on a substrate, and an array of solder balls mounted on the bottom of the substrate are used to attach the package to a PC board or motherboard. In contrast, leaded plastic packages use lead frames on the outer edges of the package substrate to attach the package to the PC board.

In order to test the reliability of the integrated circuit packages, the packages are subjected to qualification tests. The most critical and expensive test is to put the packages under bias, moisture, and high-temperature conditions, which is referred to as a Bias/Humidity/Temperature (BHT) test, including some highly accelerated versions known as (HAST).

To perform a HAST test, the packages must be placed into a separate device, called a stress socket, that makes an external electrical connection with the package. For purpose of example, these connections will be described in terms of BGAs. The stress socket also includes a lid that clamps down on the BGA package to apply pressure. The stress sockets containing the packages are then attached to a board, and the board is then placed into a HAST chamber for testing. After HAST testing, the packages are removed from the stress sockets and then placed into another test apparatus for automated electrical testing (ATE). The ATE tester requires the use of a different socket for forming an electrical connection with the packages.

Although the method described above for performing HAST testing works for its intended purpose, the method has several disadvantages. First, stress sockets are expensive because they must be custom made. Integrated circuit packages come in a variety of shapes and sizes. For example, a BGA package may have anywhere from 200 to 3000 balls. Therefore, custom stress sockets must be designed and manufactured for each type of package to be tested, which is both time-consuming and expensive. Further adding to the cost of stress sockets is the materials required to build the sockets. The sockets must be made to withstand the test atmosphere, which is a very harsh condition varying up to 130° C. and 2.2 atmosphere of H2O pressure. Consequently, the sockets tend to be large and thick, adding to the cost of the materials.

Another disadvantage is that because the sockets are custom designed, so must the boards that the sockets attach to. Custom designed boards can also be expensive, especially since the boards must also be able to withstand the harsh test conditions. In addition, a minimum of 45 packages are needed for testing, which requires a significant number of boards to mount the sockets.

A further disadvantage is that due to the relatively large size of the sockets, the number of sockets that can be mounted on one board is limited, which limits the number of packages that can be placed into the HAST chamber at any one time. Finally, for interim leakage test times, it is also time consuming to remove the packages from the sockets on the board and reconnect them to sockets on the ATE tester. Requiring that the packages be attached from one testing device, removed, and reattached to another testing device is inefficient and time-consuming.

As an example of the cost and time required by the above method, consider the situation where a 50 mm 2397 BGA needs to be qualification tested using conventional sockets and boards. In today's dollars, the cost of designing and manufacturing the required number of board-mounted sockets (45) is approximately $250,000, and a 16–17 week lead-time is required for the design, production, and assembly. Adding to this cost is the fact that the boards require frequent routine maintenance, which is also costly and time consuming. Such costs are becoming prohibitive as integrated circuit packages become larger in size.

Accordingly, what is needed is an improved method and system for performing qualification test on integrated circuit packages.

SUMMARY OF THE INVENTION

The present invention provides an interposer card for mounting integrated circuit packages that eliminates the need for sockets and custom boards during qualification tests. The interposer card includes pads for mounting the I/Os of a test package; edge card connectors for connecting the interposer card directly to a test board and for performing bias testing on the test package; and pads for replicating the test package I/Os for connecting the interposer card to an automated electrical testing (ATE) system for performing ATE tests on the test package.

A further aspect of the present invention provides a universal stress board (USB) containing multiple pairs of adjustable mating female connectors for mounting the interposer cards via the edge card connectors. Because the connectors are adjustable, the USB can accommodate different sizes of interposer cards, eliminating the need for custom boards. In addition, the interposer cards can be mounted on both sides of the USB, thereby increasing a number of interposer cards that can be placed into a HAST chamber.

According to the system and method disclosed herein, the interposer card and universal stress board, eliminates both sockets and boards for B/H/T stress testing and enables both edge card and BGA connections to be made in the same design. The cost of designing and manufacturing the interposer card is a small fraction of the conventional method and the savings will increase as future larger pin count packages are tested. The design of the interposer card also decreases lead-time (4–5 weeks), and virtually eliminates board/socket maintenance and storage.

DETAILED DESCRIPTION

The present invention relates to techniques for performing qualification test on integrated circuit packages, such as flip-chip BGA packages. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides an interposer daughter card for testing integrated circuit packages (hereinafter test packages) that eliminates both the above-described stress sockets and boards previously required to perform pre-qualification tests, such as B/H/T. According to the present invention, the interposer daughter card contains both pads for mounting a test package, edge card connectors for bias testing, and a replication of the test package connection for performing automated electrical testing (ATE) of the test package.

Figure 1:
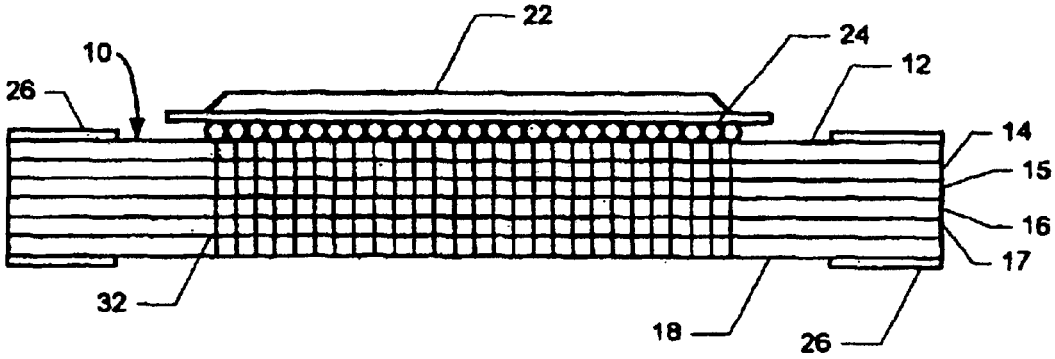
FIG. 1 is a cross-sectional view of the interposer daughter card (IDC) of the present invention.
Figure 2:
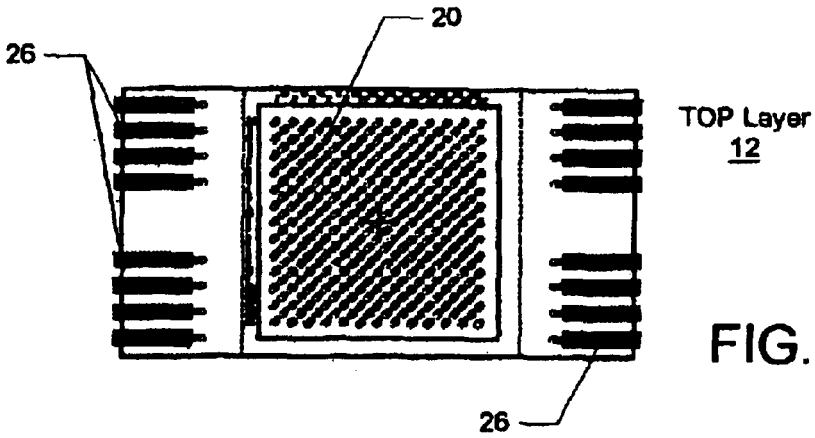
FIG. 2 is a top view of the top layer of the IDC.
Figure 3:
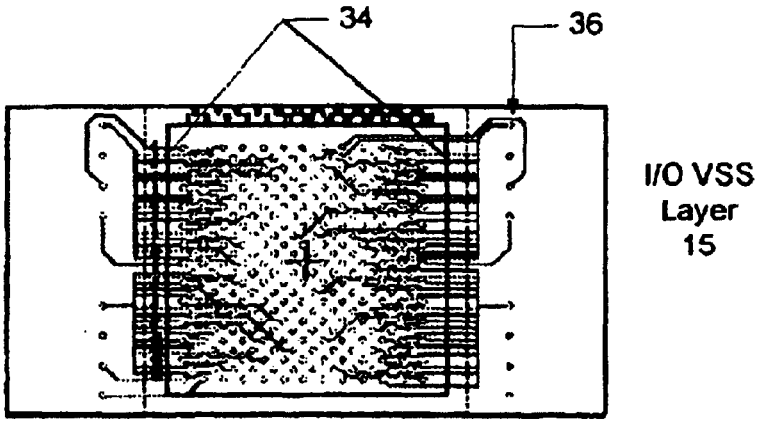
FIG. 3 is a top view of the I/O Vss layer of the IDC.
Figure 4:
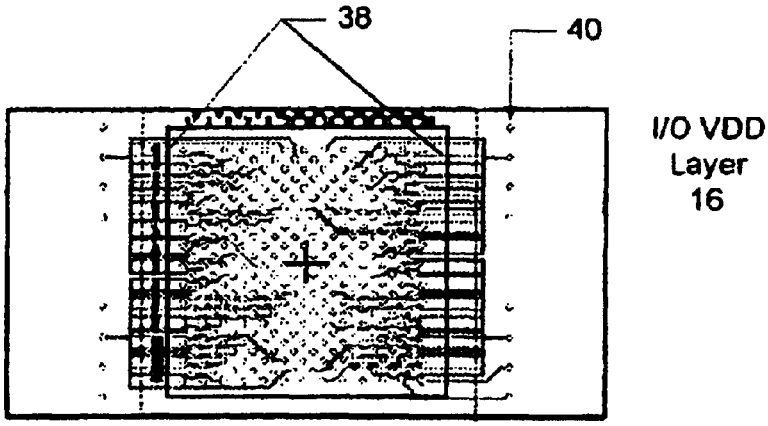
FIG. 4 is a top view of the I/O Vdd layer of the IDC.
Figure 5:
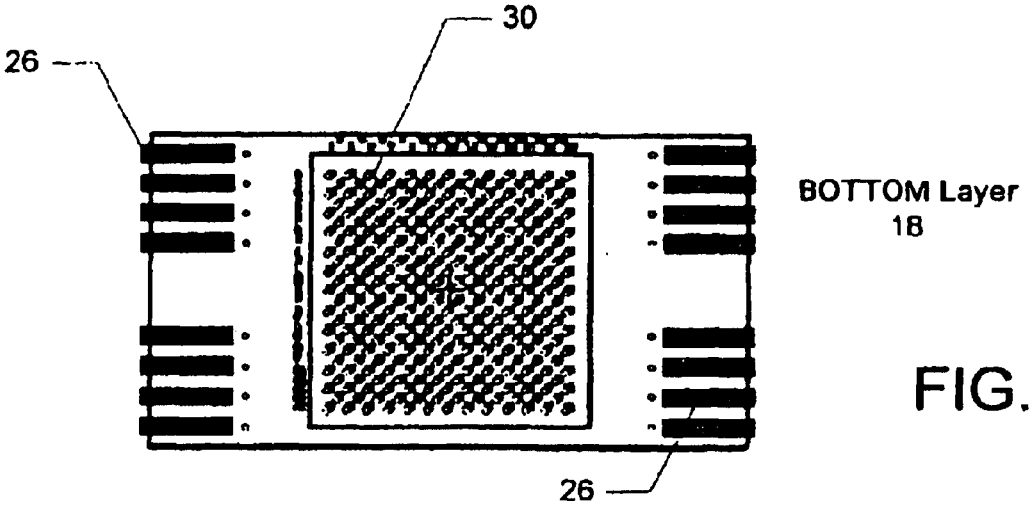
FIG. 5 is a bottom view of the bottom layer of the IDC.

FIG. 1 is a cross-sectional view of the interposer daughter card of the present invention. In a preferred embodiment, the interposer daughter card (IDC) 10 includes six layers: a top layer 12 comprising Solder Ball Attach Pads (SBAP), a second layer comprising a Vss plate 14, a third layer comprising I/O Vss connections 15, a fourth layer comprising I/O Vdd connections 16, a fifth layer comprising a Vdd plane 17, and a bottom layer 18 comprising ATE Test Pads (ATP) 30. FIG. 2 is a top view of the top layer 12. FIG. 3 is a top view of the I/O Vss layer 15. FIG. 4 is a top view of the I/O Vdd layer 16. And FIG. 5 is a bottom view of the bottom layer 18. Being a typically board design, the IDC 10 includes a core (not shown). Additional intermediate layers can also be added to accommodate additional amounts of I/O connections.

Referring to FIG. 2, the top layer 12 of the IDC 10 includes a predefined number of individual female connectors, referred to as Solder Ball Attach Pads (SBAP) 20, edge card connectors 26, and cutting guides 28. The SBAPs 20 are for surface mounting the I/Os 24 of a test package 22. In a preferred embodiment, the test package 22 is a BGA package, which is shown FIG. 1 surface mounted on the top layer 12 of IDC 10. The SBAPs 20 shown in FIG. 2 are therefore a type suitable for receiving the balls of the BGA package 22. The balls of the BGA package 22 are preferably attached to the SBAPs 20 with solder paste utilizing a typical surface amount procedure.

Referring to FIG. 5 the bottom layer 18 of the IDC 10 is similar to the top player 12 in that the bottom layer 18 also includes a plurality of pads, ATPS 30 and edge card connectors 26. The ATPs 30 on the bottom layer 18 effectively replicate 22) directly to an ATE tester.

The edge card connectors 26 on the top and bottom layers 12 and 18 of the IDC 10 are for supplying external electrical connections to the IDC 10 during the B/H/T test, such as I/O, and VSS, and VDD bias. The edge card connectors 26 are preferably located along at least two edges of the IDC 10 and arranged in quadrants, as shown.

Referring to FIGS. 3 and 4, the middle layers of the IDC 10, I/O Vss layer 15, I/O Vdd layer 16 are for biasing the test package 22 during stress testing in the B/H/T or HAST chamber. They are also used for leakage or short tests during or after the stress test. Connections from the package I/Os 24 (BGAs in the example) are routed to each particular layer in the IDC 10 by vias 32 (See FIG. 1).

The test package 22 includes die (not shown) that are connected to create individual I/O pairs. Each of the pairs includes of an electrical path that forms a loop through the package beginning at the ball 24 and then routed to the first die pad, the second die pad, and to the ball 24 connected to the second die pad. Each loop is oppositely biased to an adjacent loop, providing both positive and negative loops. Electrical connection during bias is only one leg of the electrical loop.

According to the present invention, the traces 34 on the I/O Vss layer 15 connect all negative loop test package I/Os in parallel to bus bar 36. And traces 38 on the Vdd layer 16 connect all positive loop test package I/Os in parallel to bus bar 40. Only some of the balls are connected to the Vss and Vdd planes 14 and 17. [These planes are not necessary, but are used to facilitate connecting and to stiffen.] These planes are not necessary, but are used to facilitate connecting and to stiffen the IDC 10.

Thus, the IDC 10 of the present invention has a dual electrical configuration. The first is the connection of all test package I/Os 24 from the top layer SBAPs 20 to the bottom layer pads 30, and the second is a gangled connection of all commonly biased test package I/Os to the edge card connectors 26 via bus bars 36 and 40.

The middle Vss and Vdd layers 15 and 16 of the IDC 10 facilitate continuity (increased resistance) testing of the test package 22. Continuity testing is performed by connecting the package BGAs to an ATE socket on the ATE tester. However, according to the present invention, only one side of each loop (positive or negative) is commonly connected to a bus bar, and therefore leakage testing is also done by manually testing the edge card connector 26 to see if there is a common leakage between all of the commonly connected positive and the commonly connected negative loops. The exact cause of the leakage in the loop(s) cannot be identified at this time. However, splitting the loops to a subset of common positive and negative connections with separate bus bars narrows the isolation of the leakage path.

Figure 6:
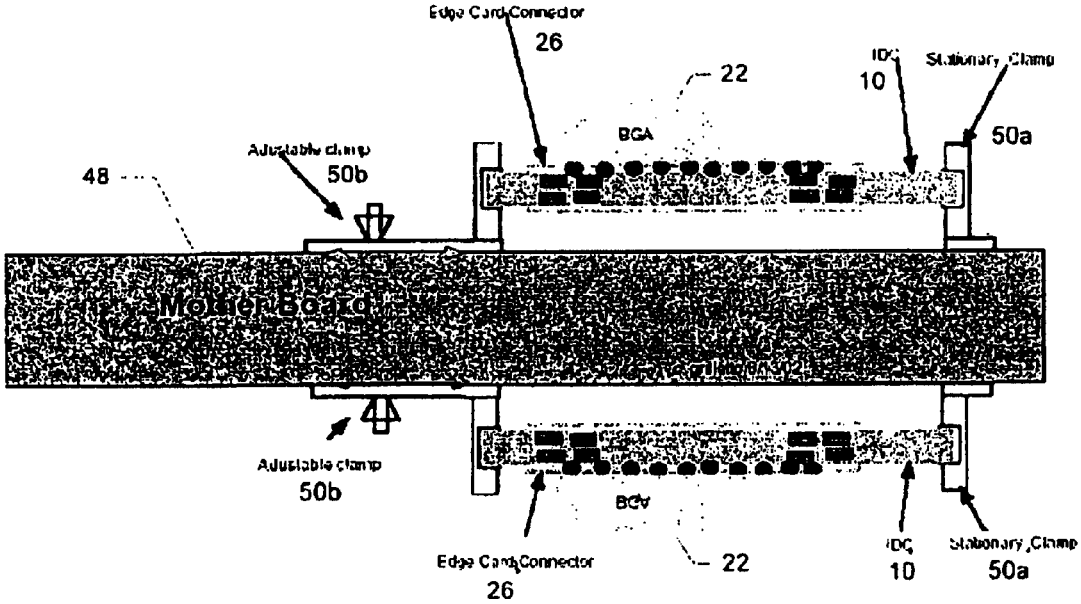
FIG. 6 is a side view of the universal stress board of the present invention.

According to another aspect of the present invention, a universal stress board is provided for mounting the IDC 10, as shown in FIG. 6.

FIG. 6 is a side view of the universal stress board of the present invention. Unlike traditional boards used for B/H/T tests, sockets are not required for mounting test packages 22. Instead, the universal stress board 48 includes multiple pairs of the IDC 10. Each pair of mating female connectors preferably includes a stationary clamp 50a for receiving one side of the IDC 10, and an adjustable clamp 50b for receiving the other side of the IDC 10. The adjustable clamp 50b can be slid horizontally along the board 48 in order to accommodate different sizes of IDCs 10, hence the name "universal" stress board.

In one preferred embodiment, the universal stress board (USB) 48 is dual sided and includes the mating female clamps 50 on both sides of the board 48. Due to the decreased size of the IDC 10 relative to prior sockets, and the dual sided nature of the USB 48, the present invention effectively doubles the number of test packages 22 that can be placed into the HAST chamber.

Testing the test package 22 using the IDC 10 is performed at interim test points as follows. First, the test package is attached directly to the IDC 10. The assembled IDC 10 is then connected to the USB 48 via the edge card connectors 26. The USB 48 is then placed in the HAST chamber and the test package 22 may be monitored for shorts in-situ.

The IDC 10 is then removed from the USB 48 and attached directly to the ATE system test socket. In the ATE tester, the test package 22 is continuity tested as usual, where leakage and shorts are tested. However, because the I/Os are ganged into four separate groups or quadrants of the edge card connectors 26, the leakage and shorts can only be traced to those quadrants.

If a leak or short is detected, the IDC 10 is removed from the ATE tester and cut along the guides 28, thereby cutting off the bus bar(s) 36 and 40 and singulating cut along the guides 28, thereby cutting off the bus bar(s) 36 and 40 and singulating the traces to isolate all of the loops. The severed IDC 10 is then placed back on the ATE tester to identify the exact location of leakage or short.

It should also be noted that the ATE test socket can also accept a severed IDC 10 for testing. After the ATE test, failure analysis is performed by first grinding off the IDC and then proceeding in the normal manner for the packaged 22 device.

An Interposer daughter card and universal stress board have been disclosed. The IDC 10 eliminates both sockets and boards for B/H/T stress testing and enables both edge card and BGA connections to be made in the same design. The IDC 10 also enables the common connections of the test package to be singulated when needed.

The cost of designing and manufacturing the IDC 10 is a small fraction of the conventional method and the savings will increase as future larger pin count packages are tested. The design of the IDC 10 also decreases lead-time, and virtually eliminates board/socket maintenance and storage.

The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

What is claimed is:

1. An interposer card, comprising:

a top layer having [the] pads *for mounting inputs and outputs* (*I/Os*) *of a test package*; at least one middle layer having a plurality of traces and at least one bus bar for forming [gangled] *ganged* connections of all commonly biased test package I/Os; and a bottom layer having pads that replicate the test package [inputs and output (I/Os)] *I/Os*; *and*

[pads for mounting I/Os of a test package;]

edge card connectors for connecting the interposer card directly to a test board and for performing bias testing on the test package; [and] *wherein the* pads [for replicating] *that replicate* the test package I/Os [for connecting] *connect* the interposer card directly to an automated electrical testing [(ATK)] (*ATE*) system for performing ATE tests on the test package.

2. The interposer card of claim 1 wherein the ganged connections can be singulated by cutting the card along the bus bar.

3. The interposer card of claim 1 further including vias extending between the top layer, the middle layers, and the bottom layers for routing connections from the test package I/Os to each of the layers.

4. The interposer card of claim 3 wherein the edge card connectors supply external electrical connections to the interposer card during the B/H/T test.

5. The interposer card of claim 4 wherein the edge card connectors are located along at least two edges of the interposer card and arranged in quadrants.

6. The interposer card of claim 4 wherein the edge card connectors are located on top and bottom layers of the interposer card.

7. The interposer card of claim 3 wherein the at least one middle layer comprises an I/O Vss layer and and I/O Vdd layer.

8. The interposer card of claim 7 wherein the test package includes negative loop I/Os and positive loop I/Os, the I/O Vss layer including traces that connect all negative loop I/Os in parallel to a first bus bar, and the I/O Vdd layer including traces that connect all positive loop test package I/Os in parallel to a second bus bar.

9. The interposer card of claim 1 wherein the edge connectors connect to a universal stress board for HAST testing, such that sockets are unnecessary for mounting the interposer card.

10. The interposer card of claim 9 wherein the universal stress board includes multiple pairs of mating female connectors for receiving the edge card connectors of multiple interposer cards.

11. The interposer card of claim 10 wherein the each pair of mating female connectors includes a stationary clamp for receiving one side of the interposer card, and an adjustable clamp for receiving the other side of the interposer card.

12. The interposer card of claim 11 wherein the adjustable clamp can be slid horizontally along the board in order to accommodate different sizes of interposer cards.

* * * * *